(12) United States Patent
Mahler et al.

(10) Patent No.: US 7,838,978 B2
(45) Date of Patent: Nov. 23, 2010

(54) SEMICONDUCTOR DEVICE

(75) Inventors: Joachim Mahler, Regensburg (DE); Henrik Ewe, Burglengenfeld (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/857,773

(22) Filed: Sep. 19, 2007

(65) Prior Publication Data

US 2009/0072413 A1  Mar. 19, 2009

(51) Int. Cl.
*H01L 23/538* (2006.01)

(52) U.S. Cl. ............... 257/686; 257/678; 257/E23.169; 257/E23.178

(58) Field of Classification Search ............... 257/686, 257/678, E23.169, E23.178
See application file for complete search history.

(56) References Cited

U.S. PATENT DOCUMENTS

| | | | |
|---|---|---|---|
| 5,352,629 A | 10/1994 | Paik et al. | |
| 5,532,512 A | 7/1996 | Fillion et al. | |
| 5,637,922 A | 6/1997 | Fillion et al. | |
| 6,362,519 B2 | 3/2002 | Moden et al. | |
| 7,112,874 B2 | 9/2006 | Atlas | |
| 7,489,044 B2* | 2/2009 | Pu et al. | 257/787 |
| 7,564,137 B2* | 7/2009 | Lam | 257/774 |
| 2005/0046002 A1 | 3/2005 | Lee et al. | |
| 2006/0091518 A1* | 5/2006 | Grafe et al. | 257/686 |
| 2008/0012110 A1* | 1/2008 | Chong et al. | 257/686 |

FOREIGN PATENT DOCUMENTS

| | | |
|---|---|---|
| CN | 1495894 | 5/2004 |
| DE | 19755398 | 9/1998 |
| DE | 69430765 | 1/2003 |
| DE | 10301091 | 7/2004 |
| DE | 10314172 | 11/2004 |
| DE | 102006012007 | 9/2006 |
| WO | 03033247 | 4/2003 |
| WO | 2004077548 | 9/2004 |

OTHER PUBLICATIONS

Chinese Office Action mailed Feb. 5, 2010.

* cited by examiner

*Primary Examiner*—Victor A Mandala
(74) *Attorney, Agent, or Firm*—Dicke, Billig & Czaja, PLLC

(57) ABSTRACT

A semiconductor device and method is disclosed. One embodiment provides a substrate and a first semiconductor chip applied over the substrate. A first electrically conductive layer is applied over the substrate and the first semiconductor chip. A first electrically insulating layer is applied over the first electrically conductive layer. A second electrically conductive layer is applied over the first electrically insulating layer.

5 Claims, 7 Drawing Sheets

SEMICONDUCTOR DEVICE

BACKGROUND

This invention relates to a semiconductor device and a method of assembling thereof.

Electronic devices may include two or more components which are electrically coupled to one another or electrically insulated from one another. The electronic devices may, therefore, contain both electrically conductive means and electrically insulating means so as to provide the desired arrangement with the device.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
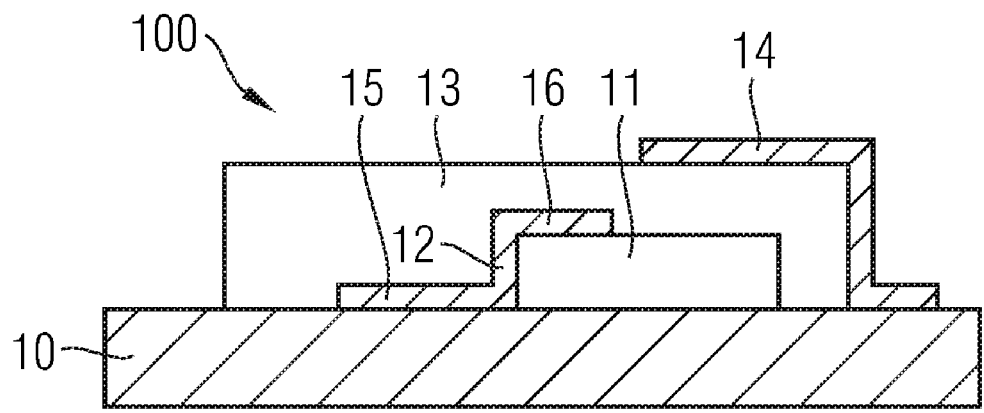
FIG. 1 schematically illustrates a device 100 according to an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with one or more semiconductor chips applied over a substrate are described below. The substrate may be of any shape, size or material. During the fabrication of the device the substrate may be provided in a way that other substrates are arranged in the vicinity and are connected by connection means to the substrate with the purpose of separating the substrates. The substrate may be fabricated from a ceramic material or may be a printed circuit board. The substrate may be electrically conductive and may be fabricated from metals or metal alloys, in particular copper, copper alloys, aluminum, aluminum alloys, or other materials. The substrate may be, for example, a leadframe or a part of a leadframe, such as a die pad. Furthermore, the substrate may include two or more elements, such as for example a die pad and leads. The substrate may have mounting surfaces. The mounting surfaces may serve to mount the substrate onto another component or may serve to mount another component onto the substrate.

The semiconductor chips described below may be of extremely different types and may include for example integrated electrical or electro-optical circuits. The semiconductor chips may be, for example, configured as power transistors, power diodes, IGBTs (Insulated Gate Bipolar Transistors), control circuits, driver circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads in particular on its two main surfaces, that is to say on its top side and bottom side. In particular, power transistors and power diodes may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied in particular as a Schottky diode. Furthermore, the devices described below may include integrated circuits to control and/or drive the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips have contact pads which allow electrical contact to be made with the semiconductor chips. The contact pads may be composed of any desired electrically conductive material, for example of a metal, such as copper, aluminum or gold, a metal alloy or an electrically conductive organic material. The contact pads may be situated on the active surfaces of the semiconductor chips or on other surfaces of the semiconductor chips. In case of a power transistor, the contact pads include drain, source and gate electrodes.

The devices described below include external contact pads. The external contact pads may be accessible from outside the device and may allow electrical contact to be made with the semiconductor chips from outside the device. Furthermore, the external contact pads may be thermally conductive and may serve as heat sinks for dissipating the heat generated by the semiconductor chips. The external contact pads may be composed of any desired electrically conductive material, for example of a metal, such as copper, aluminum or gold, a metal alloy or an electrically conductive organic material.

One or more electrically conductive layers may be applied over the substrate and/or the semiconductor chips. The electrically conductive layers may be used to make electrical contact with the semiconductor chips from outside the devices and to make electrical connections among the semiconductor chips and passives within the device. The electrically conductive layers may be manufactured with any desired geometric shape and any desired material composition. The electrically conductive layers may, for example, be composed of linear conductor tracks, but may also be in the form of a layer covering an area. Any desired electrically conductive materials, such as metals, for example copper, aluminum or gold, metal alloys or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between electrically insulating layers.

The devices may further include one or more electrically insulating layers. The electrically insulating layers may cover any fraction of any number of surfaces of the components of the device. The term "electrically insulating" refers to the property of the electrically insulating layer to be at most only marginally electrically conductive relatively to electrically conductive components of the device. The electrically insulating layers may serve various functions, they may be used, for example, to electrically insulate components of the devices from each other, but they may also be used as platforms to mount other components, such as semiconductor chips.

The devices may include a mold material covering at least parts of the components of the devices. The mold material may be any appropriate thermoplastic or thermosetting material. Various techniques may be employed to cover the components with the mold material, for example compression molding or injection molding.

FIG. 1 schematically illustrates a device 100 in a cross section as an exemplary embodiment. The device 100 includes a substrate 10 and a first semiconductor chip 11, which is mounted on the substrate 10. A first electrically conductive layer 12 is applied over the substrate 10 and the first semiconductor chip 11. A first electrically insulating layer 13 is applied over the first electrically conductive layer 12, and a second electrically conductive layer 14 is applied over the first electrically insulating layer 13.

The device 100 may further include a second semiconductor chip, which may be electrically coupled to the second electrically conductive layer 14. Moreover, the first electrically conductive layer 12 may include at least two sections 15 and 16. The section 15 or at least the lower surface of the section 15 may be coplanar with the section 16 or the lower surface of the section 16 of the first electrically conductive layer 12. The sections 15 and 16 of the first electrically conductive layer 12 may be attached to the substrate 10 and the first semiconductor chip 11, respectively.

Figure 2:
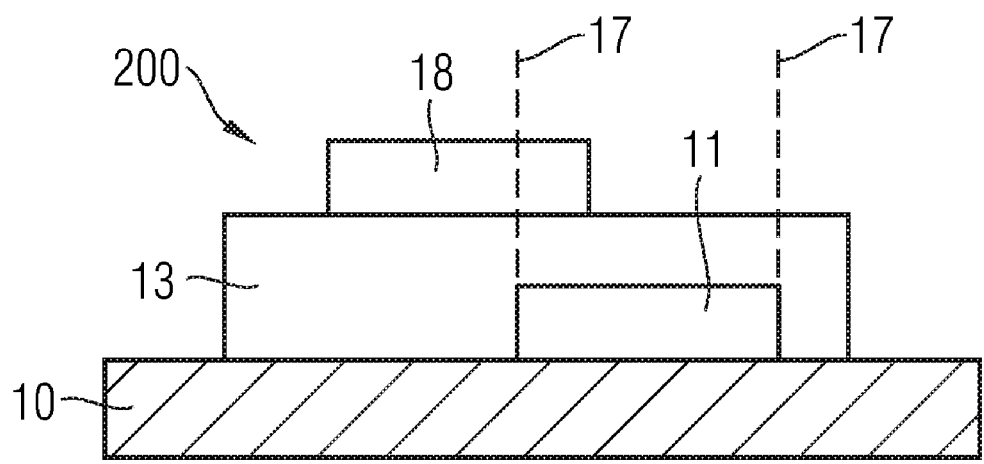
FIG. 2 schematically illustrates a device 200 according to an exemplary embodiment.

FIG. 2 schematically illustrates a device 200 in a cross section as a further exemplary embodiment. The device 200 includes the substrate 10 and the first semiconductor chip 11 mounted on the substrate 10. The first electrically insulating layer 13 is applied over the substrate 10 and the first semiconductor chip 11. The first electrically insulating layer 13 may extend beyond the first semiconductor chip 11 and may be arranged at least partly outside of a region defined by the contour of the first semiconductor chip 11. The region defined by the contour of the first semiconductor chip 11 is indicated in FIG. 2 by dashed lines denoted by the reference numeral 17. A second semiconductor chip 18 is mounted on the first electrically insulating layer 13. The second semiconductor chip 18 is arranged at least partly outside of the region 17 defined by the contour of the first semiconductor chip 11. The second semiconductor chip 18 may also be arranged completely outside of the region 17. Furthermore, further semiconductor chips or passives may be applied to the first electrically insulating layer 13 and they may be arranged inside or partly outside or completely outside of the region 17.

Figure 3A:
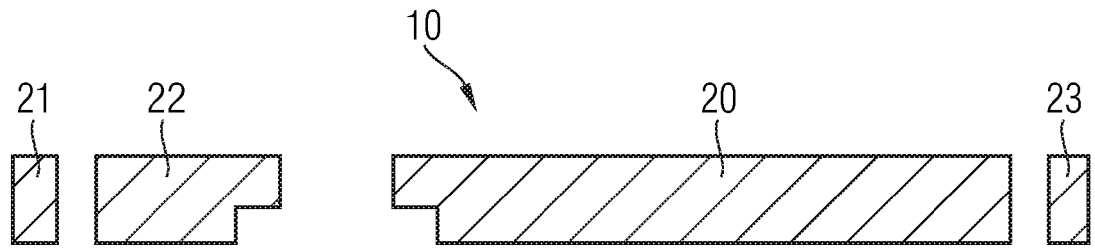
FIGS. 3A to 3M schematically illustrate an exemplary embodiment of a method to fabricate a device 300.
Figure 3B:
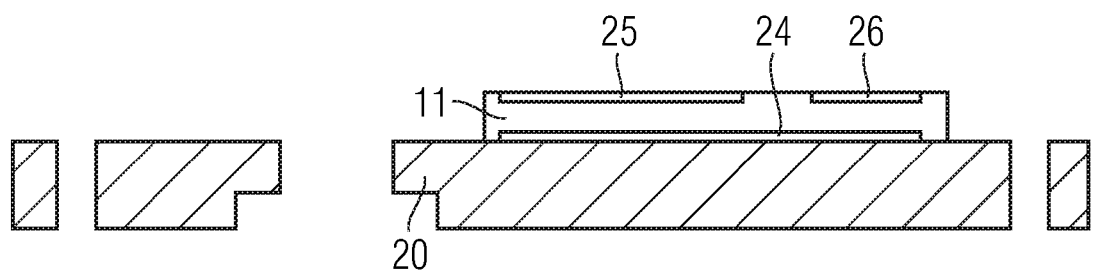
Figure 3C:
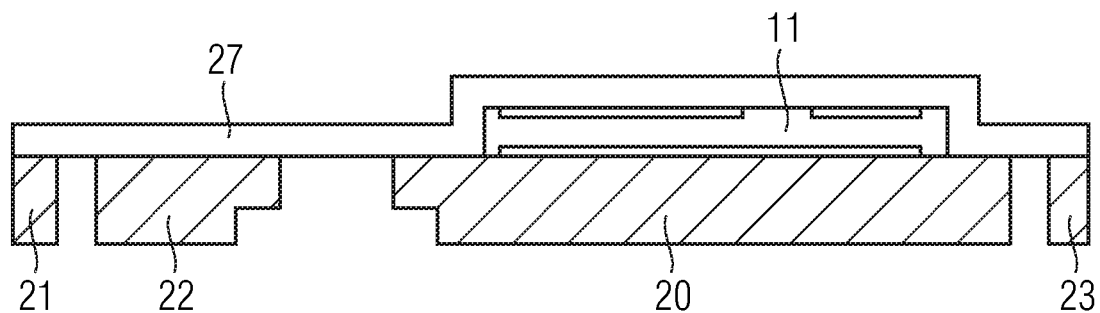
Figure 3D:
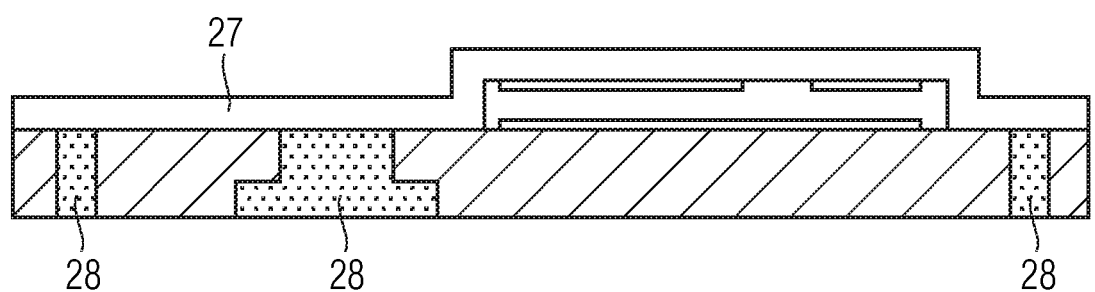
Figure 3E:
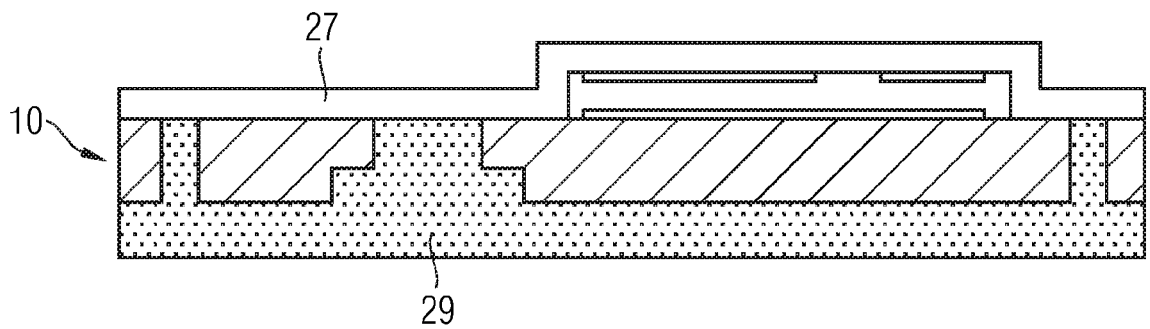
Figure 3F:
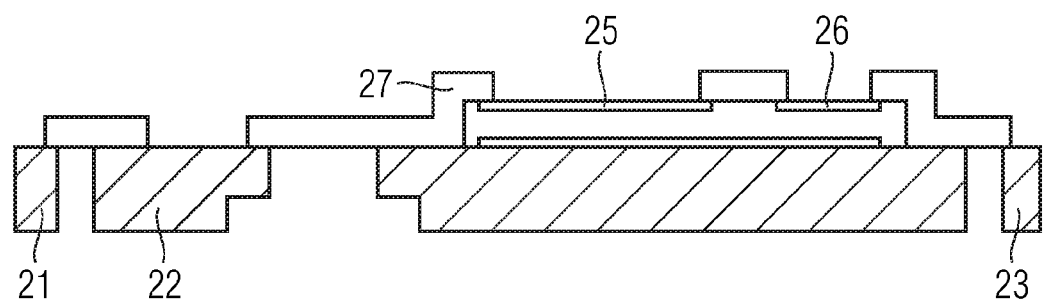
Figure 3G:
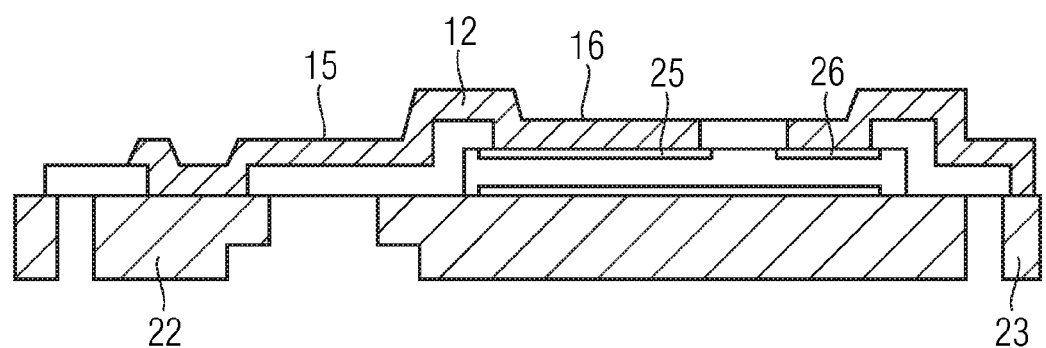
Figure 3H:
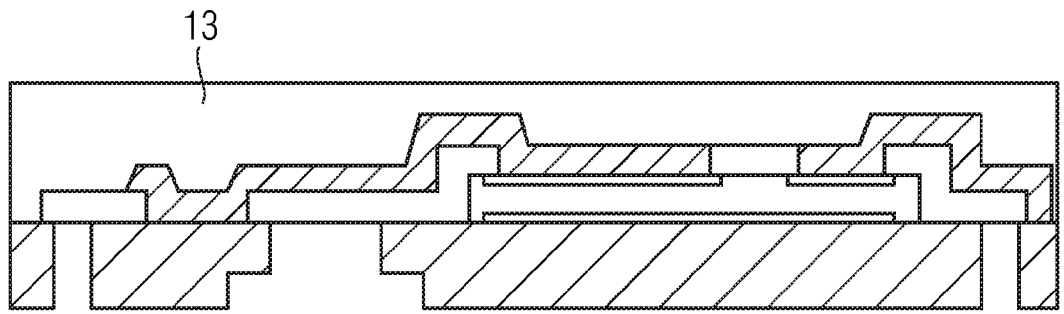
Figure 3I:
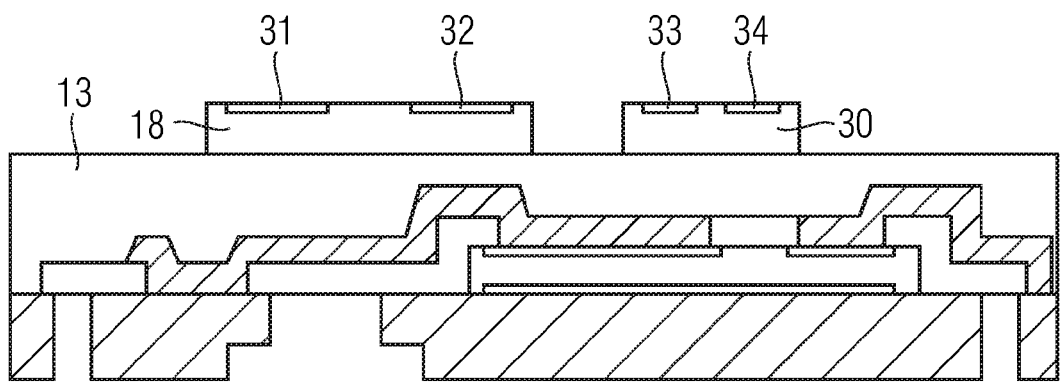
Figure 3J:
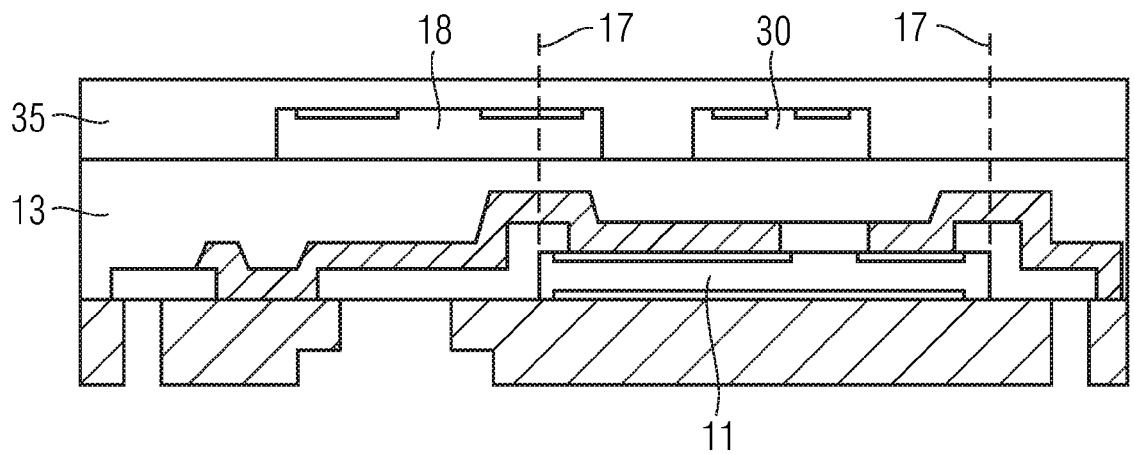
Figure 3K:
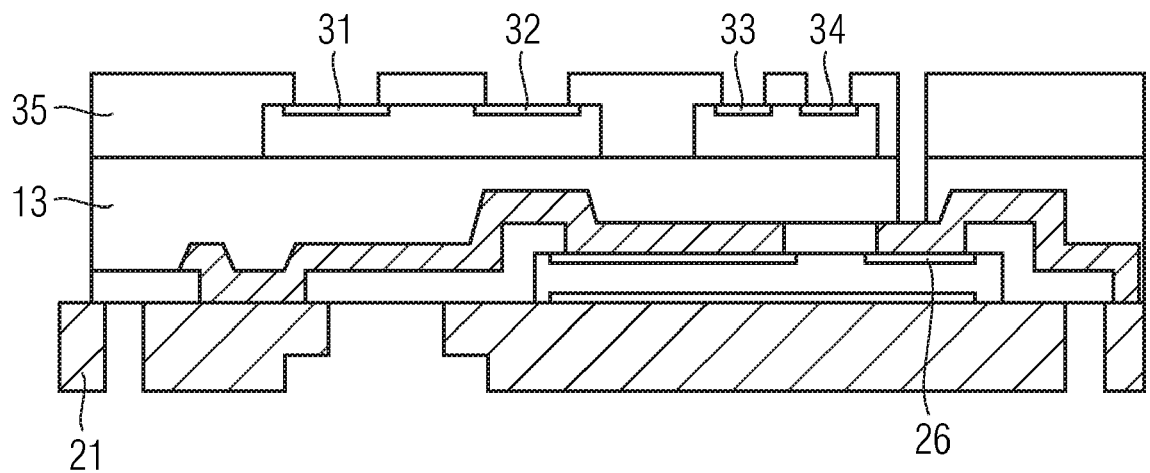
Figure 3L:
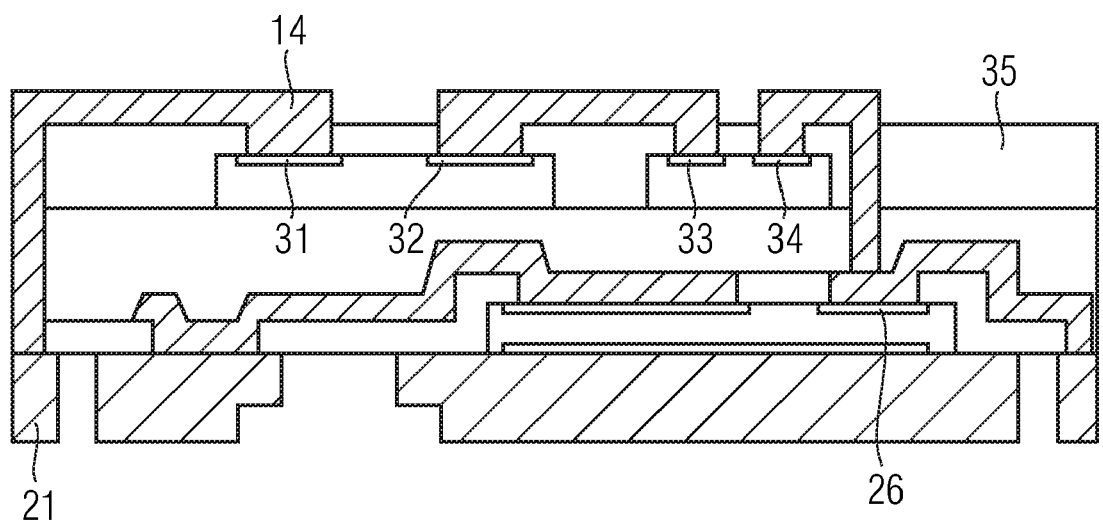
Figure 3M:
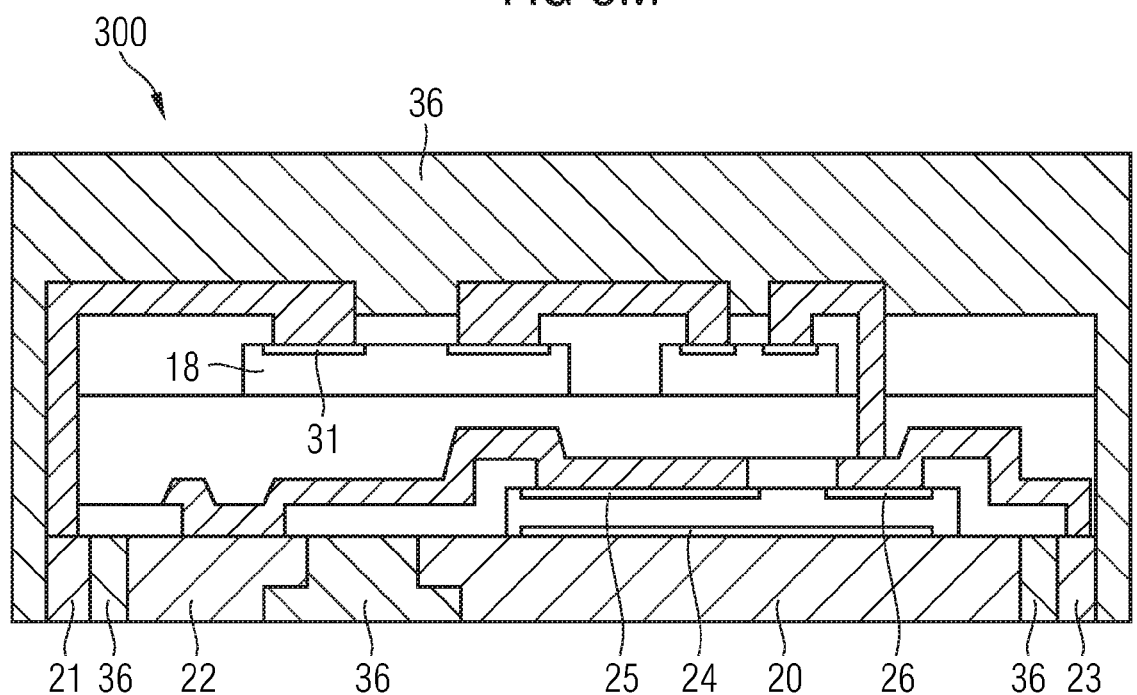

In FIGS. 3A to 3M different stages of the fabrication of a device 300, which is illustrated in FIG. 3M, are exemplarily illustrated. The device 300 is an implementation of the devices 100 and 200 illustrated in FIGS. 1 and 2. The details of the fabrication method as well as the features of the device 300 that are described below can therefore be likewise applied to the devices 100 and 200.

Firstly the substrate 10 is provided, which is illustrated in cross section in FIG. 3A. The substrate 10 may, for example, be a leadframe, which is part of a leadframe strip. The leadframe strip may be manufactured from an electrically conductive material, such as copper, or another metal or a metal alloy. At each device position of the leadframe strip, a die pad 20 and a plurality of leads, of which the leads 21, 22 and 23 are illustrated in FIG. 3A, are provided. The leads 21 to 23 are spaced at a distance from the die pad 20.

The semiconductor chip 11 is mounted on the upper surface of the die pad 20 (see FIG. 3B). In the present embodiment, the semiconductor chip 11 is a vertical power transistor, for example a MOSFET, and includes a drain electrode 24 on its lower surface and a source electrode 25 and a gate electrode 26 on its upper surface. The drain electrode 24 may be electrically connected to the upper surface of the die pad 20.

The electrical connection between the drain electrode 24 of the power transistor 11 and the die pad 20 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the die pad 20 and the power transistor 11 on account of interface diffusion processes. In this case, the use of AuSn, AgSn, CuSn, AgIn, AuIn or CuIn solders is conceivable, for example, for a copper or iron-nickel leadframe 10. If the power transistor 11 is adhesively bonded to the die pad 20, it is possible to use conductive adhesives which may be based on epoxy resins and be enriched with gold, silver, nickel or copper in order to produce the electrical conductivity.

A second electrically insulating layer 27 is then deposited onto the upper surface and the side surfaces of the power transistor 11, the exposed upper surface of the die pad 20 and the upper surfaces of the leads 21 to 23 (see FIG. 3C). The electrically insulating layer 27 may be a free-standing dielectric layer which has sufficient mechanical strength to be self-supporting. Examples of a free-standing layer are a foil or a sheet, which are, for example, made of polymers or any other suitable plastic or synthetic material. Its mechanical strength enables the dielectric layer 27 to bridge the gaps between the leads 21 to 23 and the die pad 20 and to support itself in the gap regions.

The electrically insulating layer 27 may be laminated onto the upper and side surfaces of the power transistor 11, the upper surface of the die pad 20 and the upper surface of the leads 21 to 23 by applying a vacuum as well as heat and pressure for a time suitable to adhere the electrically insulating layer 27 to the power transistor 11 and the leadframe 10.

It may also be provided that the spaces between the die pad 20 and the leads 21 to 23 are filled with a material 28 before the electrically insulating layer 27 is deposited (see FIG. 3D). In this case, other dielectric components than foils or sheet may be used to fabricate the electrically insulating layer 27. For example, the electrically insulating layer 27 may be deposited from a solution or a gas phase and may be built-up in a layer-by-layer fashion to a desired thickness. Techniques that can be employed for this kind of deposition are, for example, physical or chemical vapor deposition, spinning, dispensing or dipping. Polymers, such as parylene, or inorganic, ceramic-like materials, such as silicon-carbon compounds or CVD diamonds, may be used as materials. The material 28 may be removed after the deposition of the electrically insulating layer 27, but may also be left in the gaps. In the latter case, the material 28 should be electrically insulating.

As an alternative to the material 28 filling the spaces between the die pad 20 and the leads 21 to 23, a deformable support layer 29 may be positioned on the lower side of the leadframe 10. During the lamination process or the deposition from a solution or a gas phase, the deformable support layer 29 can be pressed into the spaces between the die pad 20 and the leads 21 to 23. The deformable support layer 29 may occupy at least some of the space or volume between the die pad 20 and the leads 21 to 23 so that the electrically insulating layer 27 may not occupy this space.

The deformable support layer 29 may be made of a silicone foil and is sufficiently flexible that it is able to be pushed into the spaces between the die pad 20 and the leads 21 to 23. The deformable support layer 29 provides a structure which prevents the region of the electrically insulating layer 27 which extends across the gaps between the die pad 20 and the leads 21 to 23 from sagging excessively into these gaps.

This arrangement enables the electrically insulating layer 27 to be self-supporting after the removal of the deformable support layer 29, even if the electrically insulating layer 27 has been deposited from a solution or a gas phase. As a result, the lower surface of the electrically insulating layer 27 is substantially coplanar with the upper surface of the leadframe 10. Consequently, the upper surface of the electrically insulating layer 27 is also free of depressions caused by sagging the electrically insulating layer 27 in the gaps.

The thickness of the electrically insulating layer 27 may be in the range from 1 to 200 μm, but may also be thicker than that.

The electrically insulating layer 27 may then be structured as illustrated in FIG. 3F. A plurality of cutouts or through-holes are created in the electrically insulating layer 27 to expose at least portions of the source electrode 25 and the gate electrode 26 of the power transistor 11 as well as the upper surfaces of the leads 21 to 23 so that electrical connections can be made to those exposed regions. The electrically insulating layer 27 may, for example, be structured by a stamping process, laser ablation, etching, photo-lithographic structuring or any other suitable process known to a person skilled in the art.

In a further embodiment, which is not illustrated in the Figures, the electrically insulating layer 27 is provided as a polymer foil or sheet with a plurality of cutouts or through-holes before it is laminated onto the power transistor 11 and the leadframe 10. The cutouts or through-holes may be provided by stamping out regions of the polymer foil or sheet. The size and arrangement of these regions correspond to the size and arrangement of the surfaces of the elements of the power transistor 11 and the leadframe 10, which are desired to be exposed.

Electrical connections between the source electrode 25 and the lead 22 as well as the gate electrode 26 and the lead 23 are produced by depositing the electrically conductive layer 12 on the electrically insulating layer 27 and its openings and structuring this layer. The completed rewiring structure is illustrated in FIG. 3G. The electrically insulating layer 27 acts as a platform for the deposition of the electrically conductive layer 12, which enables the electrically conductive layer 12 to bridge the gaps between the die pad 20 and the leads 21 to 23. Furthermore, the electrically insulating layer 27 electrically insulates the electrically conductive layer 12 from the underlying structures where necessary, such as the leadframe 10.

The electrically conductive layer 12 may be produced by electroless and/or galvanic plating processes. Thereby a seed layer is first electroless deposited onto the upper surfaces of the electrically insulating layer 27 and the exposed regions of the leadframe 10 and the power transistor 11. Materials such as palladium or titanium may be used for the seed layer which usually has a thickness of less than 1 μm.

The thickness of the seed layer may be increased by depositing a further layer of an electrically conductive material onto the seed layer. For example, a layer of copper may be electroless deposited onto the seed layer. This copper layer may have a thickness of less than 1 μm. Afterwards another layer of copper may be galvanically deposited, which may have a thickness of more than 5 μm. The electroless copper deposition may also be omitted.

The seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 5 μm.

Other deposition methods, such as physical vapor deposition, chemical vapor deposition, spin-on processes, spray depositing or ink jet printing may also be used. Copper, iron, nickel or other metals or metal alloys may be used as material. The thickness of the electrically conductive layer 12 may be in the range from 5 μm to 1 mm, in particular in the range from 50 μm to 300 μm.

The electrically conductive layer 12 may be structured after the completed deposition process of all its layers or after the deposition of the seed layer. Structuring generates physically separate conductor tracks between the electrodes 25 and 26 of the power transistor 11 and the leads 22 and 23 as illustrated in FIG. 3G. The lateral area and/or the thickness of the conductor tracks may be selected depending on the current carrying capacity which is desired for the corresponding conductor track. The conductor track electrically connecting the gate electrode 26 to the lead 23 may be laterally and/or vertically smaller than the conductor track electrically connecting the source electrode 25 to the lead 22 for example.

If it is desired to provide conductor tracks of different thicknesses, this may be provided by depositing further metal layers onto selected conductor tracks. A photoresist layer may be deposited onto the conductor tracks already formed and structured to expose the conductor tracks whose thickness it is desired to increase. A further metallic layer or layers may then be deposited by a selective deposition process or by deposition and further structuring of the deposited metal layers to increase the thickness of the selected conductor tracks.

As illustrated in FIG. 3G, the deposition methods for production of the electrically conductive layer 12 lead to coplanar sections of the electrically conductive layer 12. Two of the coplanar sections are denoted by the reference numerals 15 and 16 in FIG. 3J. Due to the employed deposition methods, the electrically conductive layer 12 may substantially follow the topology of the underlying structure. This holds true for the lower surface of the electrically conductive layer 12 and also holds true for its upper surface if the thickness of the electrically conductive layer 12 is small enough.

After the electrical connections have been made between the power transistor 11 and the leads 22 and 23 by the deposition of the conductor tracks, the electrically insulating layer 13 is deposited onto the electrically conductive layer 12 and other exposed surfaces as illustrated in FIG. 3H. The electrically insulating layer 13 may provide planar sections on its upper surface, which are coplanar to the upper surface of the leadframe 10. These planar sections may be used to mount other components, such as semiconductor chips or passives.

The electrically insulating layer 13 may be a dielectric film, foil or sheet which may be laminated onto the exposed surfaces of the underlying structure. Vacuum, heat and pressure may be applied for a time suitable to attach the electrically insulating layer 13. The electrically insulating layer 13 may be deposited from a solution or a gas phase and may be built-up in a layer-by-layer fashion to a desired thickness. Techniques that can be employed for this kind of deposition are, for example, physical or chemical vapor deposition, spinning, dispensing or dipping. Polymers, such as parylene, or inorganic, ceramic-like materials, such as silicon-carbon compounds or CVD diamonds, may be used as materials in this case. The electrically insulating layer 13 may have any desired thickness. For example, the electrically insulating layer 13 may have a thickness of more than 1 μm or more than 100 μm or more than several hundred μm. If the thickness of the electrically insulating layer 13 is small, the electrically insulating layer 13 may substantially follow the topology of the underlying structure. If the electrically insulating layer 13 has a greater thickness, planar sections are formed on its upper surface which may be used to mount components on them.

It may be provided that the electrically insulating layer 13 is deposited as a film, foil or sheet or from a solution or a gas phase and is partly hardened by a heat treatment at, for example, about 100° C. or other suitable temperatures. Then the second semiconductor chip 18 and a third semiconductor chip 30 are mounted onto the electrically insulating layer 13, which features adhesive properties when only partly hardened (see FIG. 3I). Afterwards the electrically insulating layer 13 is completely hardened at appropriate temperatures, which may be higher than 200° C. When the electrically insulating layer 13 is entirely hardened, the semiconductor chips 18 and 30 are firmly attached to the electrically insulating layer 13.

Materials that have adhesive properties when not completely hardened and that can be used for the method described above may contain polyimides, epoxides, acrylates and/or mixtures of these substances. If the electrically insulating layer 12 is deposited from a gas phase, parylenes may be used as the basic material. Parylenes become soft at temperatures of about 300° C. and thereby enable to firmly attach the semiconductor chips 18 and 30 to the electrically insulating layer 13.

In a further embodiment, which is not illustrated in the Figures, the electrically insulating layer 13 may not feature adhesive properties. In this case an additional adhesive layer is deposited on top of the electrically insulating layer 27 to attach the semiconductor chips 18 and 30.

The semiconductor chips 18 and 30 may be mounted onto the electrically insulating layer 13 with their active main surfaces facing away from the electrically insulating layer 13. In FIG. 3I, contact pads 31 and 32 of the semiconductor chip 18 and contact pads 33 and 34 of the semiconductor chip 30 are depicted. The semiconductor chips 18 and 30 may have further contact pads.

As illustrated in FIG. 3I, the electrically insulating layer 13 makes it possible that the semiconductor chip 18 is not stacked directly above the power transistor 11, but is laterally shifted and rather arranged partly outside of the region 17 defined by the contour of the power transistor 11. The upper surface of the electrically insulating layer 13 is not necessarily totally planar as illustrated in FIG. 3I. However, some sections of the upper surface of the electrically insulating layer 13 may be planar.

The semiconductor chips 18 and 30 as well as the electrically insulating layer 13 may be covered by a third electrically insulating layer 35 (see FIG. 3J). The properties and manufacturing method of the electrically insulating layer 35 may be similar to the properties and manufacturing method of the electrically insulating layers 13 and/or 27 described above.

The electrically insulating layers 13 and 35 may then be structured at the same time (see FIG. 3K). The electrically insulating layer 13 may be structured before the deposition of the electrically insulating layer 35. A plurality of cutouts or through-holes are created in the electrically insulating layers 13 and 35 to expose portions of the contact pads 31 to 34 of the semiconductor chips 18 and 30, the lead 21 and the conductor track connected to the gate electrode 26 of the power transistor 11. The electrically insulating layers 13 and 35 may, for example, be structured by a stamping process, laser ablation, etching, photo-lithographic structuring or any other suitable process known to a person skilled in the art.

Electrical connections between the lead 21 and the contact pad 31, the contact pad 32 and the contact pad 33 as well as the contact pad 34 and the gate electrode 26 are then produced by depositing the electrically conductive layer 14 on the electrically insulating layer 35 and its openings and structuring the electrically conductive layer 14. The completed rewiring structure is illustrated in FIG. 3L. The fabrication method of the electrically conductive layer 14 may be similar to the fabrication method of the electrically conductive layer 12 described above.

After the electrical connections have been made, a mold transfer process may be carried out to encapsulate the components arranged on the leadframe 10 with a mold material 36 (see FIG. 3M). The mold material 36 may encapsulate any portion of the device 300, but leaves the lower surfaces of the die pad 20 and the leads 21 to 23 uncovered. The mold material 36 may also be filled in the spaces between the die pad 20 and the leads 21 to 23. The lower surface of the mold material 36 filled in these spaces may be substantially coplanar with the lower surfaces of the die pad 20 and the leads 21 to 23.

The mold material 36 may be composed of any appropriate thermoplastic or thermosetting material, in particular it may be composed of a material commonly used in contemporary semiconductor packaging technology. Various techniques may be employed to cover the components of the device 300 with the mold material 36, for example compression molding or injection molding.

As can be seen in FIG. 3M, the device 300 is a leadless package. After the encapsulation process, the exposed surfaces of the die pad 20 and the leads 21 to 23 provide the external contact pads of the drain electrode 24, the source electrode 25 and the gate electrode 26 of the power transistor 11 as well as the contact pad 31 of the semiconductor chip 18. The external contact pads may be cleaned and tin-plated. The individual devices 300 may be then singulated from the leadframe strip.

The semiconductor chips 18 and 30 may be logic chips. For example, the semiconductor chip 18 may include a control circuit controlling the power transistor 11. The semiconductor chip 30 may include a driver circuit which generates a signal to drive the gate electrode 26 of the power transistor 11.

Figure 4:
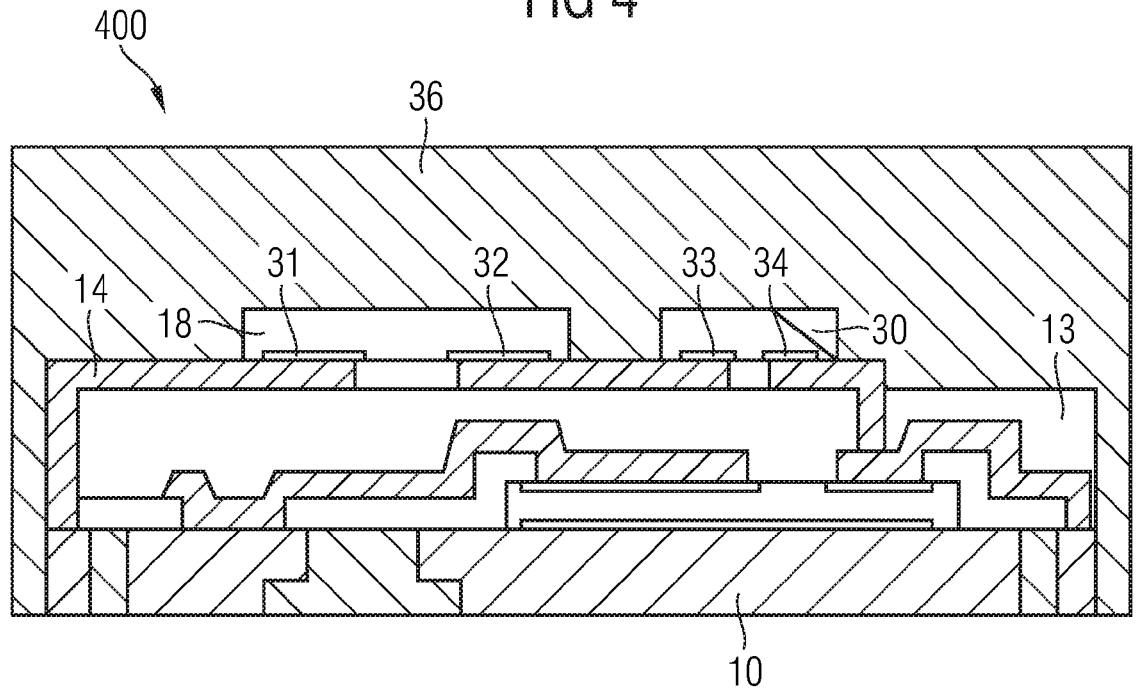
FIG. 4 schematically illustrates a device 400 according to an exemplary embodiment.

FIG. 4 schematically illustrates a device 400 in a cross section as a further exemplary embodiment. The device 400 is identical to the device 300 in many respects. However, the semiconductor chips 18 and 30 of the device 400 are arranged in a flip-chip manner meaning that the contact pads 31 to 34 of the semiconductor chips 18 and 30 face towards the leadframe 10. As can be seen in FIG. 4, the electrically conductive layer 14 is therefore arranged between the electrically insulating layer 13 and the semiconductor chips 18 and 30.

Figure 5:
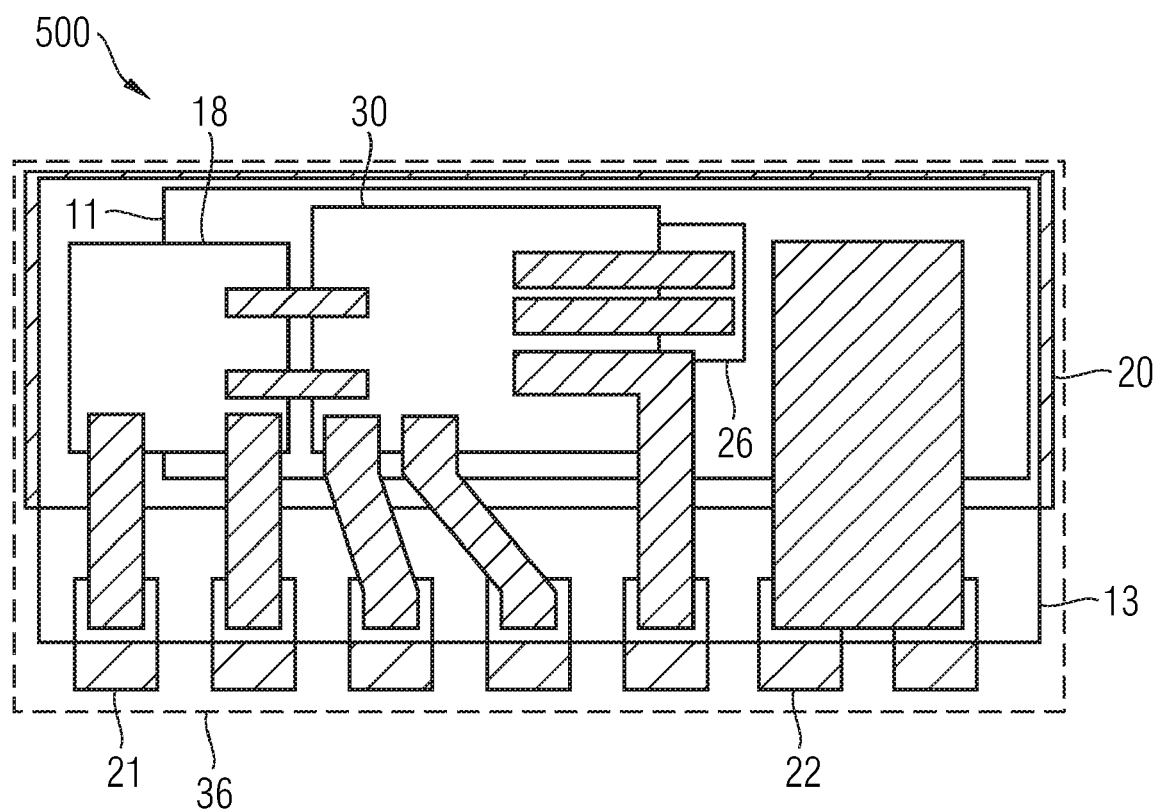
FIG. 5 schematically illustrates a device 500 according to an exemplary embodiment.

FIG. 5 schematically illustrates a device 500 in a top plan view as a further exemplary embodiment. The device 500 is an implementation of the device 300. Similar components as illustrated in FIGS. 3A to 3M are denoted by the same reference numerals in FIG. 5. FIG. 5 illustrates that the semiconductor chip 11 is mounted onto the die pad 20 and the electrically insulating layer 13 is arranged over the semiconductor chip 11 and the other components of the device 500. The electrically insulating layer 13 provides a platform to attach other semiconductor chips or passives, such as the semiconductor chips 18 and 30. The electrically insulating layer 13 insulates these semiconductor chips from the semiconductor chip 11. Due to the electrically insulating layer 13, these semiconductor chips are not necessarily arranged directly above the semiconductor chip 11, but may be laterally shifted, such as the semiconductor chip 18. Furthermore, conductor tracks are illustrated in FIG. 5, which electrically connect the contact pads and electrodes on the upper surfaces of the semiconductor chips 11, 18 and 30 among each other and/or to the leads.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a substrate:
    a first semiconductor chip applied over the substrate;
    a first electrically insulating layer applied over the first semiconductor chip and the substrate and having an upper surface opposite the first semiconductor chip and the substrate, the upper surface forming a platform; and
    a second semiconductor chip having a lower surface, wherein the entire lower surface is applied to the platform formed by the upper surface of the first electrically insulating layer, and wherein the second semiconductor is at least partly arranged outside of a region defined by a contour of the first semiconductor chip, wherein the first semiconductor chip has a first contact pad on a first main surface and a second contact pad on a second main surface.

2. The device of claim 1, comprising wherein a first electrically conductive layer is applied over the substrate and the first semiconductor chip.

3. The device of claim 1, comprising wherein a second electrically conductive layer is applied over the first electrically insulating layer.

4. The device of claim 2, comprising wherein a second electrically insulating layer is arranged between the substrate and the first electrically conductive layer.

5. The device of claim 4, wherein the substrate comprises at least two elements spaced at a distance and the second electrically insulating layer is applied over at least portions of the at least two elements of the substrate.

* * * * *